United States Patent
Furusawa et al.

(10) Patent No.: US 9,789,569 B2
(45) Date of Patent: Oct. 17, 2017

(54) SOLDER MATERIAL AND BONDED STRUCTURE

(71) Applicant: Panasonic Intellectual Property Management Co., Ltd., Osaka (JP)

(72) Inventors: Akio Furusawa, Osaka (JP); Kiyohiro Hine, Osaka (JP); Masato Mori, Hyogo (JP); Taichi Nakamura, Osaka (JP)

(73) Assignee: Panasonic Intellectual Property Managment Co., Ltd., Osaka (JP)

( * ) Notice: Subject to any disclaimer, the term of this patent is extended or adjusted under 35 U.S.C. 154(b) by 0 days.

(21) Appl. No.: 14/920,772

(22) Filed: Oct. 22, 2015

(65) Prior Publication Data

US 2016/0039052 A1    Feb. 11, 2016

Related U.S. Application Data

(63) Continuation of application No. 14/551,007, filed on Nov. 23, 2014, now Pat. No. 9,199,340.

(30) Foreign Application Priority Data

Nov. 27, 2013  (JP) .................................. 2013-245191

(51) Int. Cl.
  *H05K 1/11*    (2006.01)
  *B23K 35/26*    (2006.01)
  (Continued)

(52) U.S. Cl.
  CPC ........ *B23K 35/262* (2013.01); *B23K 35/0222* (2013.01); *B23K 35/26* (2013.01);
  (Continued)

(58) Field of Classification Search
  CPC ............ H05K 3/301; H05K 1/11; H05K 1/111
  See application file for complete search history.

(56) References Cited

U.S. PATENT DOCUMENTS

| 7,645,940 B2* | 1/2010 | Shepherd ............... H05K 1/114 |
| | | 174/250 |
| 8,961,709 B1 | 2/2015 | Takaura et al. |
| (Continued) | | |

FOREIGN PATENT DOCUMENTS

| DE | 102006047764 | 4/2008 |
| EP | 2422918 | 2/2012 |
| (Continued) | | |

OTHER PUBLICATIONS

English Translation of German Office Action dated Jun. 30, 2015 for the related German Patent Application No. 102014224245.2.

*Primary Examiner* — Jeremy C Norris
(74) *Attorney, Agent, or Firm* — Panasonic IP Management; Kerry S. Culpepper

(57) ABSTRACT

Solder material used in soldering of an Au electrode including Ni plating containing P includes Ag satisfying $0.3 \leq [Ag] \leq 4.0$, Bi satisfying $0 \leq [Bi] \leq 1.0$, and Cu satisfying $0 < [Cu] \leq 1.2$, where contents (mass %) of Ag, Bi, Cu and In in the solder material are denoted by [Ag], [Bi], [Cu], and [In], respectively. The solder material includes In in a range of $6.0 \leq [In] \leq 6.8$ when [Cu] falls within a range of $0 < [Cu] < 0.5$, In in a range of $5.2+(6-(1.55 \times [Cu]+4.428)) \leq [In] \leq 6.8$ when [Cu] falls within a range of $0.5 \leq [Cu] \leq 1.0$, In in a range of $5.2 \leq [In] \leq 6.8$ when [Cu] falls within a range of $1.0 < [Cu] \leq 1.2$. A balance includes only not less than 87 mass % of Sn.

12 Claims, 13 Drawing Sheets

(51) Int. Cl.
   *B23K 35/40*   (2006.01)
   *B23K 35/02*   (2006.01)
   *H05K 3/34*    (2006.01)
   *C22C 13/00*   (2006.01)
   *H05K 1/18*    (2006.01)
   *H05K 3/24*    (2006.01)

(52) U.S. Cl.
   CPC .............. *B23K 35/40* (2013.01); *C22C 13/00* (2013.01); *H05K 1/11* (2013.01); *H05K 1/18* (2013.01); *H05K 3/3463* (2013.01); *H05K 1/111* (2013.01); *H05K 3/244* (2013.01); *H05K 2201/0338* (2013.01); *H05K 2201/10909* (2013.01)

(56) References Cited

U.S. PATENT DOCUMENTS

| | | | |
|---|---|---|---|
| 2010/0084050 A1 | 4/2010 | Kraemer et al. | |
| 2010/0129964 A1* | 5/2010 | Goh | H01L 21/4832 438/124 |
| 2010/0307823 A1 | 12/2010 | Kawamata et al. | |
| 2011/0120769 A1 | 5/2011 | Sakatani et al. | |
| 2011/0291282 A1 | 12/2011 | Yamada et al. | |
| 2015/0144388 A1 | 5/2015 | Furusawa et al. | |

FOREIGN PATENT DOCUMENTS

| | | |
|---|---|---|
| JP | 8-206874 | 8/1996 |
| JP | 3040929 | 5/2000 |
| JP | 2002-120085 | 4/2002 |
| JP | 2010-179336 | 8/2010 |
| JP | 2013-193092 | 9/2013 |
| JP | 5280520 | 9/2013 |
| JP | 5732627 B | 6/2015 |
| JP | 5920752 B | 5/2016 |
| WO | 97/09455 | 3/1997 |
| WO | 97/43456 | 11/1997 |
| WO | 2005/084877 | 9/2005 |
| WO | 2009/011392 | 1/2009 |
| WO | 2010/122764 | 10/2010 |

* cited by examiner

SOLDER MATERIAL AND BONDED STRUCTURE

BACKGROUND OF THE INVENTION

1. Technical Field

The present disclosure mainly relates to solder material of solder paste or the like used in soldering in an electronic circuit board, and a bonded structure using the solder material.

2. Background Art

For soldering an electronic circuit board and an electronic component to each other, solder material having a composition of Sn—Ag—Bi—In consisting of four types of elements is used, which is disclosed in, for example, Patent Literatures 1 and 2. In such solder material, thermal fatigue properties with respect to fatigue fracture occurring due to thermal stress accompanied by a temperature change are enhanced by a technique using an effect of solid solution. The solid solution denotes a technique of preventing deterioration of solder material by replacing a part of metal atoms arranged in a lattice with a different metal atom so as to distort such a lattice.

CITATION LIST

Patent Literature

PTL 1: Japanese patent No. 3040929
PTL 2: Japanese Patent Application Unexamined Publication No. 2010-179336

SUMMARY OF THE INVENTION

Solder material in accordance with the present disclosure is solder material used in soldering of an Au (gold) electrode including Ni (nickel) plating containing P (phosphorous), including:
  Ag (silver) satisfying 0.3≤[Ag]≤4.0;
  Bi (bismuth) satisfying 0≤[Bi]≤1.0; and
  Cu (copper) satisfying 0<[Cu]≤1.2; and
  further including:
  In (indium) in a range of 6.0≤[In]≤6.8 when [Cu] falls within a range of 0<[Cu]<0.5;
  In in a range of 5.2+(6−(1.55×[Cu]+4.428))≤[In]≤6.8 when [Cu] falls within a range of 0.5≤[Cu]≤1.0;
  In in a range of 5.2≤[In]≤6.8 when [Cu] falls within a range of 1.0<[Cu]≤1.2,
  with a balance including only not less than 87 mass % of Sn (tin),
  where contents (mass %) of Ag, Bi, Cu and In in the solder material are denoted by [Ag], [Bi], [Cu], and [In], respectively.

DETAILED DESCRIPTION OF THE INVENTION

In an electronic circuit board, as disclosed in PTL 2, in general, a Cu (copper) substrate electrode whose electrode material is Cu is used in many cases.

However, since vehicle-mounted products such as an ECU (Engine Control Unit), a DC/DC converter, an inverter, and a head lamp require high bonding reliability, an Au substrate electrode, to which Au (gold) flash plating is applied by flash treatment of carrying out thin plating for a short time, may be used.

Figure 14:
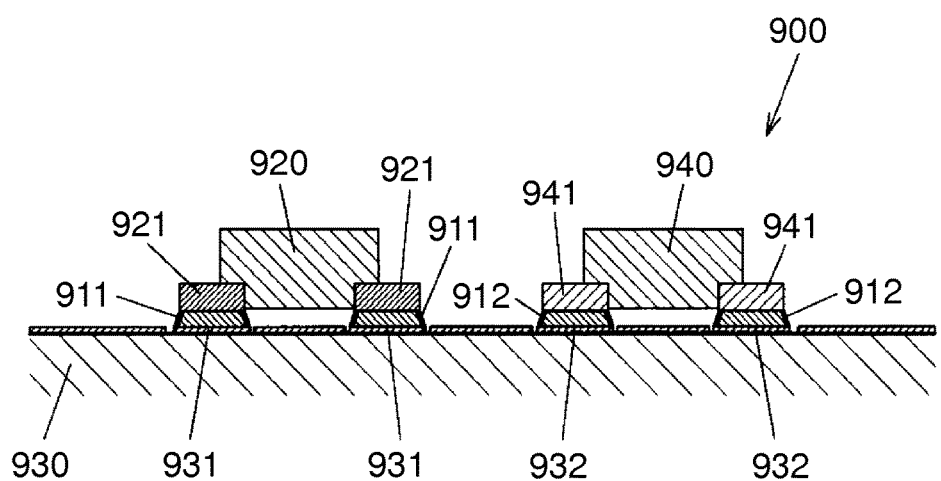
FIG. 14 is a schematic sectional view of a bonded structure using a conventional solder material.

As an example, FIG. 14 shows a sectional view of bonded structure 900. Bonded structure 900 is configured by bonding electronic circuit board 930 having Au substrate electrodes 931 and 932 to electronic component 920 having Cu component electrodes 921 and electronic component 940 having Au component electrodes 941 by soldering. Au substrate electrodes 931 of electronic circuit board 930 and Cu component electrodes 921 of electronic component 920 are bonded to each other with solder portions 911. Furthermore, Au substrate electrodes 932 of electronic circuit board 930 and Au component electrodes 941 of electronic component 940 are bonded to each other with solder portion 912. Solder portions 911 and 912 are formed of solder material having a composition of Sn (tin)-Ag (silver)-Bi (bismuth)-In (indium).

In the solder material having a composition of Sn—Ag—Bi—In, In is solid-dissolved in a lattice of Sn, so that the thermal fatigue properties are enhanced. Specifically, solder material having a composition of, for example, Sn-3.5 mass % Ag-0.5 mass % Bi-6 mass % In, is used. Ag is added to improve alloy strength by deposition strengthening and to lower the melting point. Bi is added to lower the melting point.

However, it has been found that the solder material having a composition of Sn—Ag—Bi—In does not necessarily have high thermal fatigue properties in soldering to the Au substrate electrode.

The present inventors have analyzed the reason thereof as follows. That is to say, in the solder material having a composition of Sn—Ag—Bi—In, the thermal fatigue properties are changed by an In content (indium content). The thermal fatigue properties herein are defined as a number of cycles in which occurrence of cracks is not found in a cross-sectional observation of the solder portion after a heat cycle test is carried out under the test conditions of −40° C./150° C. (conditions for the reliability test of a vehicle-mounted product). For example, when a case where the composition of the solder material after soldering is Sn-3.5 mass % Ag-0.5 mass % Bi-6 mass % In and a case where the composition is Sn-3.5 mass % Ag-0.5 mass % Bi-5.5 mass % In are compared with each other, the numbers of cycles in the heat cycle tests are 2300 cycles and 2150 cycles, respectively. That is to say, as the reduction of In, the number of cycles (thermal fatigue properties) is also reduced.

The alloy strength on the thermal fatigue properties is increased until the In content is increased to about 6 mass %, and is reduced when the In content exceeds this value. In other words, when the In content is about 6 mass %, the number of cycles in the heat cycle test is increased, so that the thermal fatigue properties are highest. Therefore, in order to efficiently use the solid solution effect by In, it is desirable to precisely control the In content in the solder material.

The Au substrate electrode has a structure in which Ni (nickel) plating having a film thickness of 1 to 5 μm is applied to the Cu electrode, and, furthermore, Au flash plating having a film thickness of 0.03 to 0.07 μm is applied to the Ni plating. In soldering with heating, Au is dissolved in Sn—Ag—Bi—In, and Ni plating is exposed. The Ni plating has a composition of 90 mass % Ni and 10 mass % P (phosphorous). Since the reactivity between In and P is high, In and P are reacted with each other to generate a compound InP having a composition of In—P. Then, In solid-dissolved in a lattice of Sn, which contributes to improvement of the thermal fatigue properties, is reduced, and the substantial In content is reduced.

Herein, in order to enhance the thermal fatigue properties of the Au substrate electrode whose In content after soldering is reduced, increasing of the In content in the solder material having a Sn—Ag—Bi—In composition before soldering is considered. However, electronic components to be mounted on one electronic circuit board may include a component having an Au component electrode and a component having a Cu component electrode. These two type of component electrodes have different changes of the In content in the solder material, and the reduction amount of the In content is small in the Cu component electrode. Therefore, in order to prevent the In reduction after soldering of the Au substrate electrode, even if the In content in the solder material before soldering is increased, the thermal fatigue properties of the Cu component electrode are reduced. Thus, it has been necessary to consider means other than the addition of In.

The solder material of the present disclosure has been invented in view of the above-mentioned problems, and is effective to form a solder portion having excellent thermal fatigue properties even if an Au electrode and a Cu electrode are mixed, for example, when an electronic circuit board and an electronic component are bonded to each other by soldering.

Hereinafter, an embodiment is described in detail with reference to drawings.

(Embodiment)

Firstly, a principle on solder material in accordance with this embodiment is described in detail.

Figure 1:
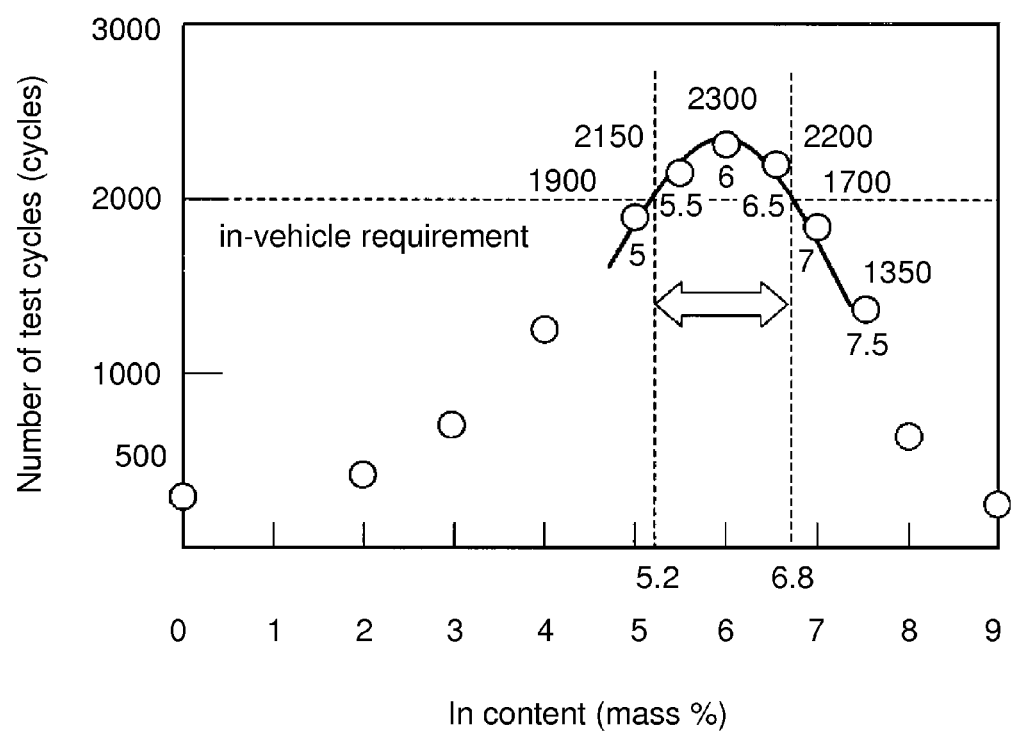
FIG. 1 is a graph for illustrating solder material in accordance with an embodiment, showing results of a reliability test of an alloy having a composition of Sn-3.5 mass % Ag-0.5 mass % Bi to which In is added.

FIG. 1 is a graph for illustrating solder material in accordance with this embodiment, showing results of a reliability test of an alloy having a composition of Sn-3.5 mass % Ag-0.5 mass % Bi to which In is added.

An In content (indium content) in the abscissa of the graph shown in FIG. 1 is a substantial In content of In solid-dissolved in a solder portion, more specifically, in a lattice of Sn, after soldering.

A number of test cycles in the ordinate of the graph shown in FIG. 1 shows the number of cycles in which occurrence of cracks has not been found in a cross-sectional observation of the solder portion after a heat cycle test is carried out. The test is carried out at −40° C./150° C. on an FR5 substrate on which a chip capacitor having a 1608 size (1.6 mm×0.8 mm) is mounted and whose FR grade (Flame Retardant grade) is FR-5 grade.

In the reliability test of vehicle-mounted products mounted in the vicinity of an engine of an automobile, requirements specification requires that the number of cycles is not less than 2000 cycles as an in-vehicle requirement. Herein, when the number of cycles is not less than 2000 cycles, the thermal fatigue properties are defined to be sufficiently satisfied.

According to the graph shown in FIG. 1, when the content of In solid-dissolved in the solder portion after soldering is 5.5 mass % (2150 cycles), 6.0 mass % (2300 cycles) and 6.5 mass % (2200 cycles), the number of cycles is not less than 2000 cycles. When the In content is not more than 5.0 mass % or not less than 7.0 mass %, the number of cycles is less than 2000 cycles.

An approximating curve drawn by using the above-mentioned numeric data is shown in FIG. 1 as a graph of the quadratic function represented by the following mathematical formula.

(Number of Test Cycles)=−410.7×(In content)$^2$+ 4919.6×(In content)−12446

Herein, a range of the In content enabling not less than 2000 cycles of the number of cycles as the in-vehicle requirement to be assured is about 5.2 to 6.8 mass % with a control width being about ±0.8 mass %.

Furthermore, since a fluctuation range of the In content in a solder alloy in mass production is about ±0.5 mass %, the median value of the In content is desirably not less than 5.7 (=5.2+0.5) mass % and not more than 6.3 (=6.8−0.5) mass %.

Figure 2A:
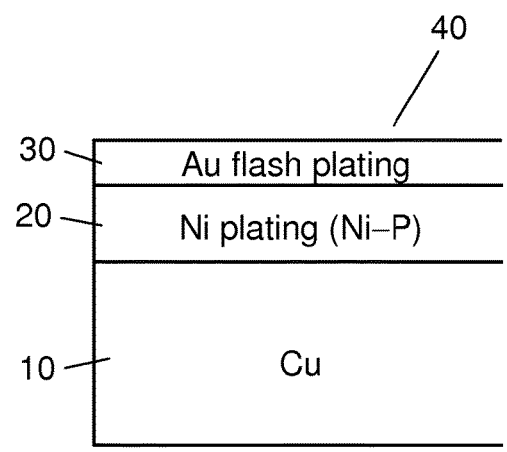
FIG. 2A is a sectional view schematically showing an Au electrode.

Next, mainly with reference to FIGS. 2A to 4, an influence of P contained in the Ni plating is described. In order to examine this influence, test samples for measurement shown in FIGS. 2A and 2B are used as Au electrode 40 and Cu electrode 50.

Figure 2B:
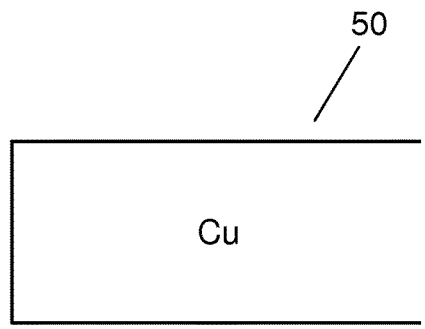
FIG. 2B is a sectional view schematically showing a Cu electrode.

FIG. 2A is a sectional view schematically showing Au electrode 40. FIG. 2B is a sectional view schematically showing Cu electrode 50.

Figure 3A:
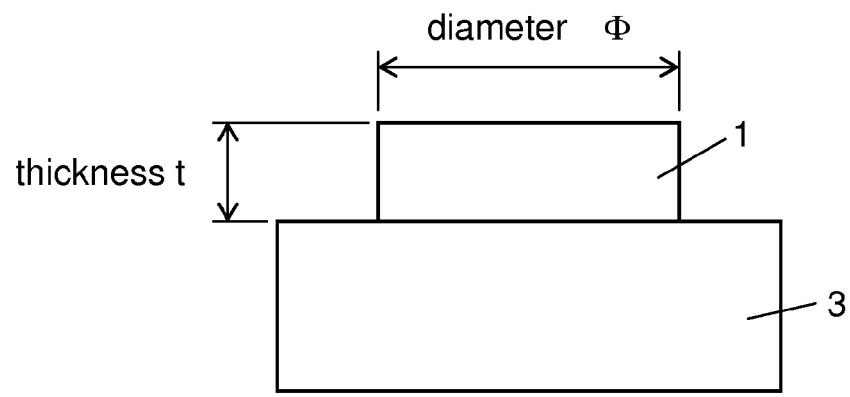
FIG. 3A is a sectional view showing a state of solder material supplied onto an electrode (before soldering) for measuring an In content (indium content) after an electrode and solder material are bonded to each other.
Figure 3B:
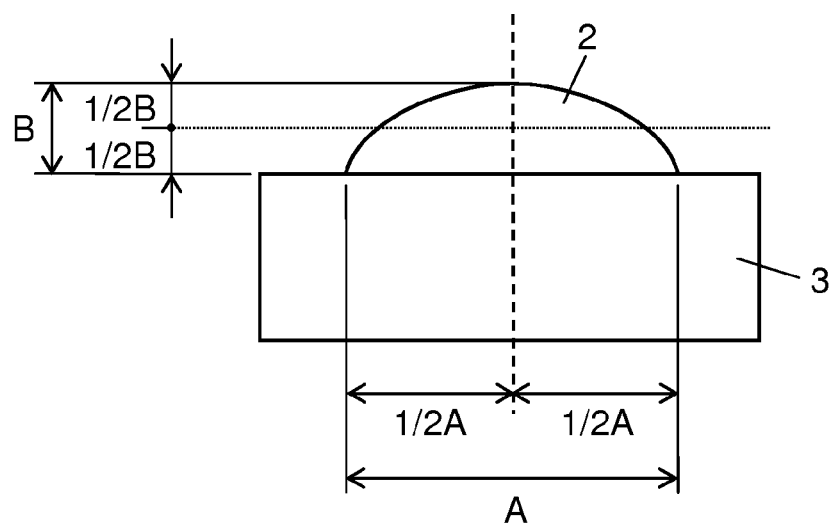
FIG. 3B is a sectional view showing a state of solder portion formed on the electrode (after soldering) for measuring the In content after the electrode and the solder material are bonded to each other.

FIGS. 3A and 3B are schematic illustration views showing a state of measuring an In content after electrode 3 and solder material 1 are bonded to each other. Electrode 3 is an Au electrode or a Cu electrode, and solder material 1 has a composition of Sn-3.5 mass % Ag-0.5 mass % Bi-6.0 mass % In. FIG. 3A is a sectional view showing a state before solder material 1 supplied onto electrode 3 is heated (before soldering), and FIG. 3B is a sectional view showing a state of solder portion 2 in which solder material 1 supplied onto electrode 3 is heated, melted and wet-spread (after soldering).

Generally used Au electrode 40 includes Cu electrode 10, Ni plating 20 provided on Cu electrode 10, and Au flash plating 30 provided on Ni plating 20 as shown in FIG. 2A. Cu electrode 10 is formed of a Cu foil having a film thickness of, for example, 35 μm. Ni plating 20 has a film thickness of, for example, 1 to 5 μm, and is provided as electroless plating which does not require an electric current to flow unlike electroplating. Au flash plating 30 has a film thickness of, for example, 0.03 to 0.07 μm. On the other hand, Cu electrode 50 is formed of a Cu foil having a film thickness of 35 μm as shown in FIG. 2B.

Au electrode 40 and Cu electrode 50 as mentioned above are used as a substrate electrode of an electronic circuit board, or as a component electrode of an electronic component. The technique of the present disclosure includes a case in which an electronic circuit board is provided with an Au substrate electrode and a Cu substrate electrode and a case in which an electronic component is provided with an Au component electrode and a Cu component electrode.

In this embodiment, two types of Au electrodes are prepared as test samples for the reliability test. A first Au electrode includes Ni plating having a film thickness of 5 μm and Au flash plating having a film thickness of 0.07 μm. This assumes that one of a substrate side or a component side is the Au electrode. A second Au electrode includes Ni plating having a film thickness of 10 μm, and Au flash plating having a film thickness of 0.07 μm. This assumes that both the substrate side and the component side are Au electrodes, and that an influence of P is maximum. When the solder material is melted into a liquid during soldering, Au and Ni instantaneously diffuse to react with the solder material. Therefore, by doubling the thickness of Ni containing P, the case in which both the substrate side and the component side are Au electrodes can be simulated.

As shown in FIG. 3A, solder material having a composition of Sn-3.5 mass % Ag-0.5 mass % Bi-6.0 mass % In, which has a circular shape having a diameter φ of 5 mm and a shape having a thickness t of 0.15 mm seen in the plan view, is supplied onto electrode 3. Electrode 3 is any one of the above-mentioned two types of electrodes, that is, the Au electrode and the Cu electrode. Thereafter, electrode 3 supplied with solder material 1 is heated on a hot plate at 240° C. for 30 seconds, and then gradually cooled at room temperature. Thus, solder material 1 is formed into solder portion 2 having a shape as shown in FIG. 3B.

As mentioned above, the test samples of solder portion 2 are obtained. Next, solder portion 2 is polished so that the longitudinal section thereof appears, and the In content of the center part of the longitudinal section is measured by analyzing by a method using EDX (Energy Dispersive X-ray spectroscopy). The center part herein denotes a part corresponding to a position at ½ of the thickness of solder portion 2 and at ½ of wet-spread width A of solder portion 2.

Figure 4:
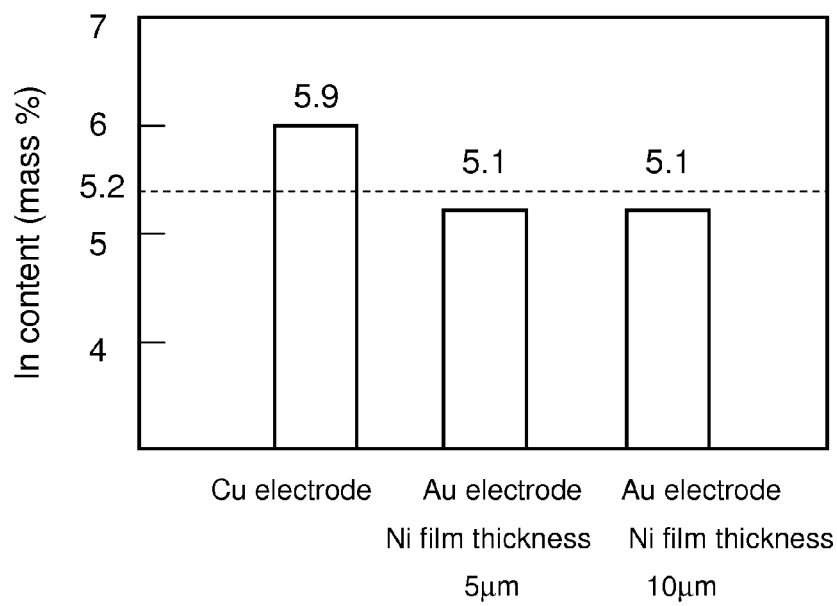
FIG. 4 is a graph for illustrating the solder material in accordance with this embodiment, showing analysis results of the In content inside the solder of each of the Cu electrode and two types of Au electrodes using solder material having a composition of Sn-3.5 mass % Ag-0.5 mass % Bi-6.0 mass % In after soldering.

FIG. 4 is a graph for illustrating the solder material in accordance with this embodiment, showing analysis results of the In content inside the solder of the Cu electrode and two types of Au electrodes using solder material having a composition of Sn-3.5 mass % Ag-0.5 mass % Bi-6.0 mass % In after soldering.

The substantial In content of In solid-dissolved in a lattice of Sn contributing to improvement of the thermal fatigue properties is reduced from 6.0 mass % as the initial In content. The In content is 5.9 mass % in the Cu electrode, 5.1 mass % in the Au electrode including Ni plating whose film thickness is 5 μm, and 5.1 mass % in the Au electrode including Ni plating whose film thickness is 10 μm.

In the Au electrode, Au diffuses to the inside of the solder material at the time of heating, and Ni plating having a composition of 90 mass % Ni and 10 mass % P, which is formed under the Au flash plating, is exposed.

Thus, since Sn included in the solder material is reacted with Ni to generate a $Ni_3Sn_4$ compound, the Ni content is reduced and the P content is increased at a solder material side of the Ni plating. A portion in which P is concentrated, P per unit area that is brought into contact with the solder material is increased. Consequently, the production amount of the compound InP is increased and In solid-dissolved in the lattice of Sn is reduced, so that the substantial In content in the case of the Au electrode is largely reduced as compared with the case of the Cu electrode.

Since the range of the In content corresponding to the in-vehicle requirement is about 5.2 to 6.8 mass %, the case of the Au electrode mentioned above does not satisfy the in-vehicle requirement.

Note here that the specific gravity of the Ni plating is 7.9 g/cm$^3$. A mass of P contained in the Ni plating can be calculated from 7.9×T×S×0.1 by using film thickness T of the Ni plating and area S of the Ni plating, and the mass of P contained in the Ni plating fluctuates in proportion to film thickness T of the Ni plating.

Based on such a phenomenon, the present inventors have found that it is effective to reduce the production amount of a $Ni_3Sn_4$ compound, in order to suppress the concentration of P that is a cause of the increase in the production amount of an InP compound.

Examples of elements for generating an intermetallic compound with Sn include Zn, Co, Mn, and the like. Among these elements, an element which has been found to have a high effect is Cu. Cu is reacted with Sn to generate a $Cu_6Sn_5$ compound.

Figure 5:
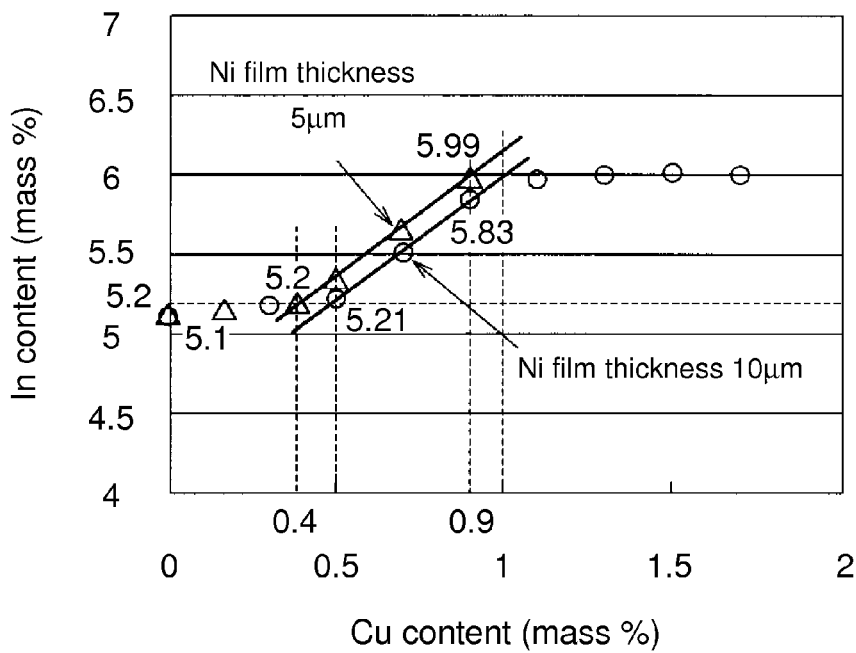
FIG. 5 is a graph for illustrating solder material in accordance with the embodiment, showing analysis results of the In content inside the solder of two types of Au electrodes having different film thicknesses using solder material having a composition of Sn-3.5 mass % Ag-0.5 mass % Bi-6.0 mass % In to which Cu is added, after soldering.
Figure 6:
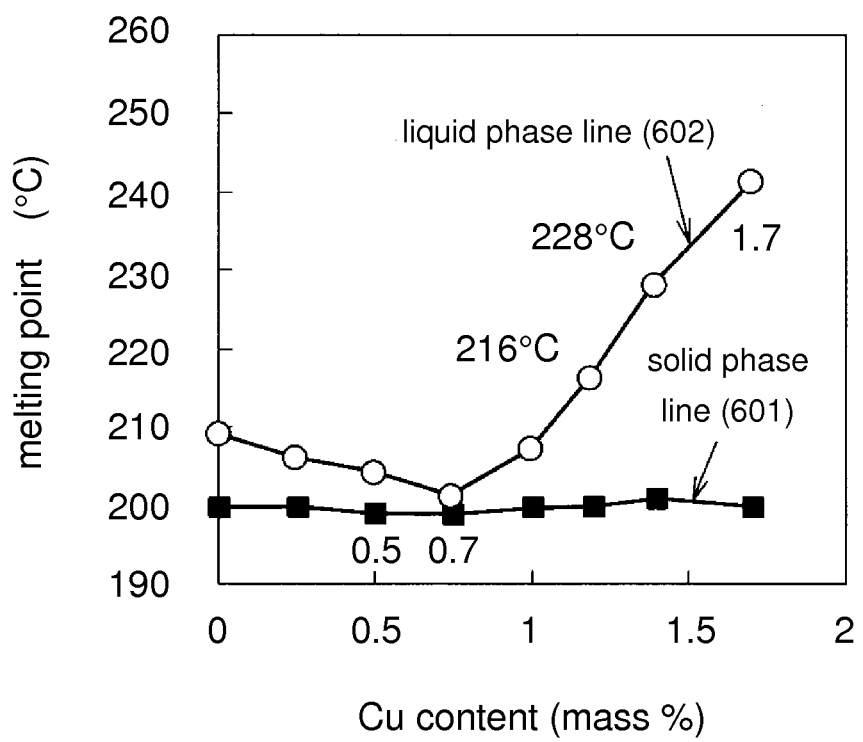
FIG. 6 is a graph for illustrating solder material in accordance with the embodiment, showing a solid phase line and a liquid phase line of solder material having a composition of Sn-3.5 mass % Ag-0.5 mass % Bi-6.0 mass % In to which Cu is added.

Herein, the solder material in accordance with this embodiment is described more specifically with reference to FIGS. 5 and 6.

FIG. 5 is a graph for illustrating solder material in accordance with the embodiment, showing analysis results of the In content inside the solder of two types of Au electrodes having different film thicknesses using solder material having a composition of Sn-3.5 mass % Ag-0.5 mass % Bi-6.0 mass % In to which Cu is added, after soldering. The film thicknesses of the Ni plating in the two types of Au electrodes are 5 μm and 10 μm, and the film thickness of the Au flash plating is uniformly 0.07 μm.

FIG. 6 is a graph for illustrating solder material in accordance with the embodiment, showing solid phase line 601 and liquid phase line 602 of the solder material having a composition of Sn-3.5 mass % Ag-0.5 mass % Bi-6.0 mass % In to which Cu is added.

Firstly, with reference to FIG. 5, the lower limit of the Cu content is described.

Herein, an analysis is carried out by the method mentioned above so as to measure the In content after soldering to the Au electrode.

The test samples of the solder material are produced as follows.

Firstly, 89.5 g of Sn is placed in a ceramic crucible, and the crucible is stood still in an electric jacket heater whose temperature has been adjusted to 500° C.

Next, melting of Sn is observed, and then 6.0 g of In is placed into the crucible, followed by stirring for three minutes.

Next, 0.5 g of Bi is placed into the crucible, followed by stirring for further three minutes.

Next, 3.5 g of Ag is placed into the crucible, followed by stirring for further three minutes.

Next, a predetermined amount of Cu is placed into the crucible, followed by stirring for further three minutes.

Note here that each element of Sn, Bi, Ag, and Cu used herein includes a slight amount of impurities.

Thereafter, the crucible is taken out from the electric jacket heater, and cooled by immersing it into a container filled with 25° C. water.

In FIG. 5, the In content in the Au electrode including the Ni plating having a film thickness of 5 μm is plotted with "Δ." The In content after soldering to the Au electrode including the Ni plating having a film thickness of 5 μm is denoted as follows. (1) It is 5.1 mass % when the Cu content is zero, but (2) it is increased because the reduction of In is suppressed when the Cu content is increased, (3) it is 5.2 mass % when the Cu content is 0.4 mass %, and then (4) it is 5.99 mass % when the Cu content becomes 0.9 mass %. In this way, when the Cu content is changed from zero to 0.9 mass %, the In content is changed from 5.1 mass % to 5.99 mass %.

In FIG. 5, the In content in the Au electrode including the Ni plating having a film thickness of 10 μm is plotted with "o." The In content after soldering to the Au electrode including the Ni plating having a film thickness of 10 μm is denoted as follows, (1) It is 5.1 mass % when the Cu content is zero, but (2) it is increased because the reduction of In is suppressed when the Cu content is increased, (3) it is 5.21 mass % when the Cu content is 0.5 mass %, and then (4) it is 5.83 mass % when the Cu content is 0.9 mass %. In this way, when the Cu content is changed from zero to 0.9 mass %, the In content is changed from 5.1 mass % to 5.83 mass %.

When a case where the film thickness of the Ni plating is 5 μm and a case where it is 10 μm are compared with each other, the change amount of the In content is larger in the Ni plating having a film thickness of 10 μm in which both the substrate electrode and the component electrode are assumed to be an Au electrode. Therefore, it is desirable that the lower limit value of the Cu content is calculated from numeric values in the case where the film thickness of the Ni plating is 10 μm.

In the case where the film thickness of the Ni plating is 10 μm, when an approximate straight line is drawn using numeric values at the time when the Cu content is from 0.5 mass % to 0.9 mass %, a graph of a linear function represented by the following mathematical formula is obtained.

$$(\text{In content}) = 1.55 \times (\text{Cu content}) + 4.428$$

Therefore, in order to assure the In content of not less than 5.2 mass %, which satisfies the in-vehicle requirement also in a combination with the Au electrode, the Cu content is desirably not less than 0.50 mass %. When the Cu content is not less than 0.50 mass %, also in the combination with the Au electrode, the In content after soldering is not less than 5.2 mass %, and the reliability of the in-vehicle requirement can be satisfied.

As mentioned above, a case using the solder material having a composition of Sn-3.5 mass % Ag-0.5 mass % Bi-6.0 mass % In is described. The change amount of the In content when the Cu content is 0.50 mass % is 0.8 mass %. Therefore, for example, when the solder material having a composition of Sn-3.5 mass % Ag-0.5 mass % Bi-5.5 mass % In having different In contents is used, the In content after soldering is 4.7 mass %, and the reliability of the in-vehicle requirement cannot be satisfied. In this way, as shown in FIG. 5, when the Cu content is not less than 0.5 mass % and not more than 1.0 mass %, the Cu content and the In content have correlation represented by the approximate straight line therebetween. When the Cu content is less than 0.5 mass % and more than 1.0 mass %, the correlation is not observed.

Figure 7:
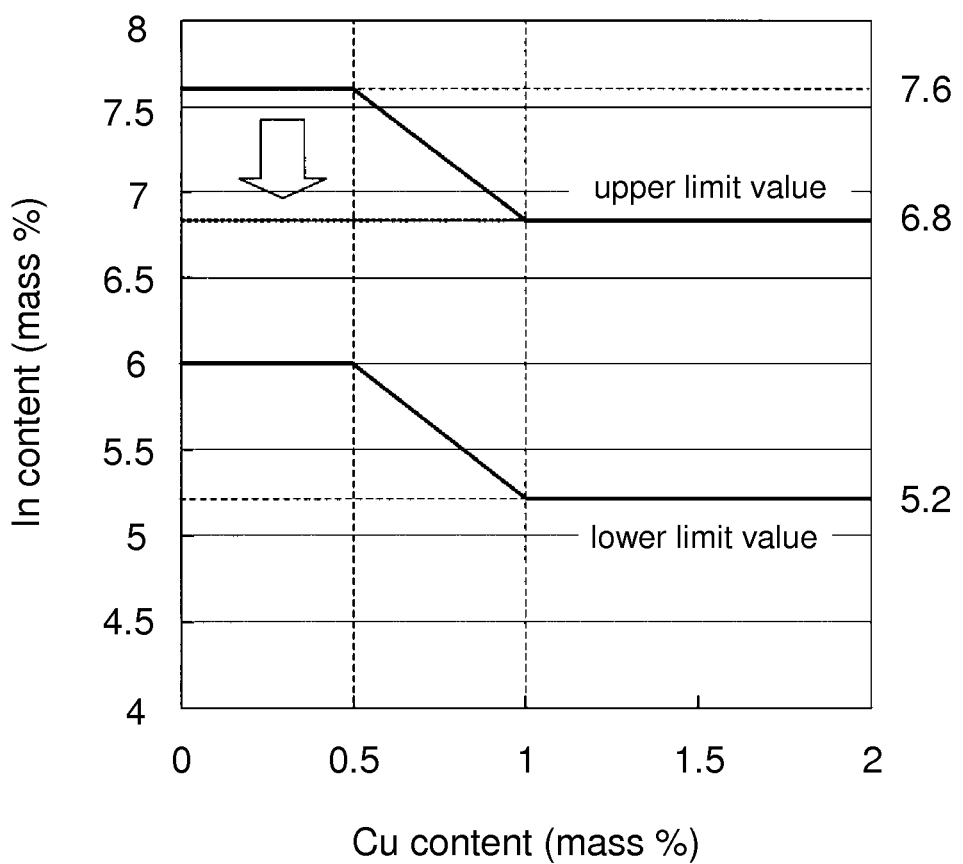
FIG. 7 is a graph showing a relation between a Cu content and the In content in the solder material before the upper limit of the Cu content is not considered in accordance with the embodiment.

FIG. 7 is a graph showing a relation between the Cu content and the In content in the solder material in accordance with the embodiment. Hereinafter, the contents (mass %) of Ag, Bi, Cu, and In in the solder material may be represented by [Ag], [Bi], [Cu], and [In], respectively.

The lower limit of the In content is determined for each range of three divided ranges of the Cu content.

That is to say, when [Cu] falls within a range of 0<[Cu]<0.5, 6.0≤[In] is satisfied.

Furthermore, when [Cu] falls within a range of 0.5≤[Cu]≤1.0, 5.2+(6−(1.55×[Cu]+4.428))≤[In] is satisfied.

Furthermore, when [Cu] falls within a range of 1.0<[Cu], 5.2 [In] is satisfied.

On the other hand, the upper limit value of the In content also is determined for each range of three divided ranges of the Cu content.

That is to say, when [Cu] falls within the range of 0<[Cu]<0.5, [In]≤7.6 is satisfied.

Furthermore, when [Cu] falls within the range of 0.5≤[Cu]≤1.0, [In]≤6.8+(6−(1.55×[Cu]+4.428)) is satisfied.

Furthermore, when [Cu] falls within the range of 1.0<[Cu], [In] ≤6.8 is satisfied.

As mentioned above, the combination including the Au electrode is described. However, in the case of the Cu electrode, since a compound to be reacted with In is not included, the In content is not reduced.

Figure 8A:
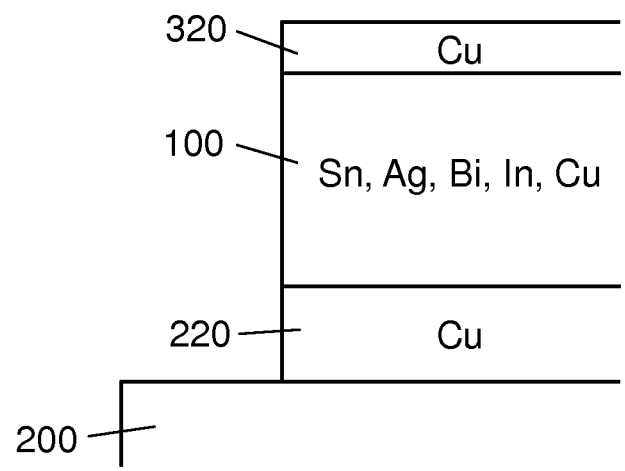
FIG. 8A is a sectional view schematically showing a structure before a Cu substrate electrode of an electronic circuit board and a Cu component electrode of an electronic component are soldered to each other.
Figure 8B:
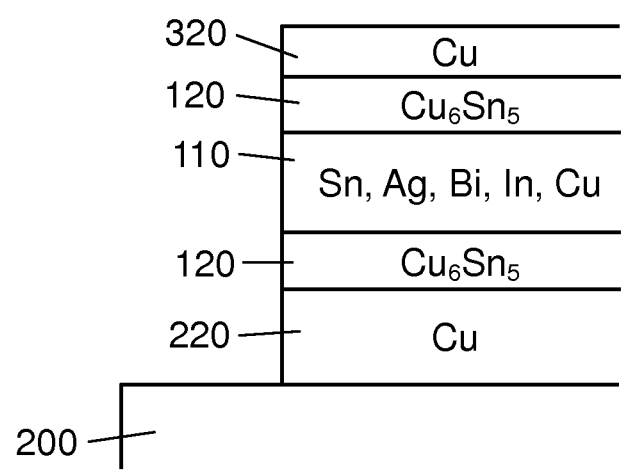
FIG. 8B is a sectional view showing a structure after the Cu substrate electrode of the electronic circuit board and the Cu component electrode of the electronic component are soldered to each other.

FIG. 8A is a sectional view schematically showing a structure before Cu substrate electrode 220 of electronic circuit board 200 and Cu component electrode 320 of the electronic component are soldered to each other. Solder material 100 having a composition of Sn—Ag—Bi—In—Cu is interposed between Cu substrate electrode 220 and Cu component electrode 320. FIG. 8B is a sectional view schematically showing a structure after Cu substrate electrode 220 of electronic circuit board 200 and Cu component electrode 320 of the electronic component are soldered to each other. Cu$_6$Sn$_5$ compound 120 is generated between Cu substrate electrode 220 and solder portion 110. The similar compound 120 is generated also between Cu component electrode 320 and solder portion 110. Since In is not involved in the generation of Cu$_6$Sn$_5$ compound 120, the reduction in the In content in solder material 100 does not occur. Note here that in FIGS. 8A and 8B, the electronic components are not shown.

As mentioned above, when the solder material of the present disclosure is used in a combination which does not include the Au electrode, the In content is not reduced, so that when the Cu content is not more than 1.0 mass %, the In content may exceed 6.8 mass % as the in-vehicle requirement. Therefore, in order to allow the solder material of the present disclosure to be used in both the combination including the Au electrode and the combination that does not include the Au electrode, it is necessary to limit the In content to not more than 6.8 mass % when the Cu content is in the range of not more than 1.0 mass %.

Next, the upper limit of the Cu content is described with reference to FIG. 6.

When the Cu content is too large, since a temperature of liquid phase line 602 is increased, the melting property of the solder material is reduced and the wet-spreading property is easily deteriorated.

Specifically, the liquid phase line temperature represented by liquid phase line 602 is increased when the Cu content exceeds 0.7 mass %, and the temperature is 216° C. when the Cu content is 1.2 mass %, and 228° C. when the Cu content is 1.4 mass %. The solid phase line temperature represented by solid phase line 601 is stable in a range from 199° C. to 201° C.

Herein, the solid phase line temperature is a temperature at which a heated solder alloy starts to be melted from a solid state, and the liquid phase line temperature is a temperature at which all the heated solder alloy is completed to be melted from the solid state.

Table 1 shows relation between the Cu content and wet spread in the solder material having a composition of Sn-3.5 mass % Ag-0.5 mass % Bi-6.0 mass % In to which Cu is added. Specifically, the wet spread on the Au electrode is evaluated when the Cu content is 0.2 mass %, 0.5 mass %, 0.7 mass %, 1.0 mass %, 1.2 mass %, 1.4 mass %, and 1.7 mass %, respectively.

As mentioned above, the mass of P contained in the Ni plating fluctuates in proportion to the film thickness T of the Ni plating. Herein, the film thickness of the Ni plating approaches the lower limit, and the content of P becomes minimum. From this viewpoint, it is assumed that the wet-spreading property is not excellent. Therefore, in the test samples produced so that the film thickness of the Ni plating is 1 μm, a wet-spreading rate is measured by a spread testing method specified in "Solder flux test method" of JIS Z 3197.

TABLE 1

| | Cu content (mass %) | | | | | | |
|---|---|---|---|---|---|---|---|
| | 0.2 | 0.5 | 0.7 | 1.0 | 1.2 | 1.4 | 1.7 |
| Wet spread | W3 | W3 | W3 | W3 | W3 | W2 | W1 |

In Table 1, in evaluation of the wet spread, "W3" shows that the wet-spread rate is not less than 90%, "W2" shows that the wet-spread rate is not less than 85% and less than 90%, and "W1" shows that the wet-spread rate is less than 85%, respectively.

From Table 1, in order to assure the wet-spread rate of not less than 90%, which is important for excellent soldering, the Cu content is desirably not more than 1.2 mass %.

Figure 9:
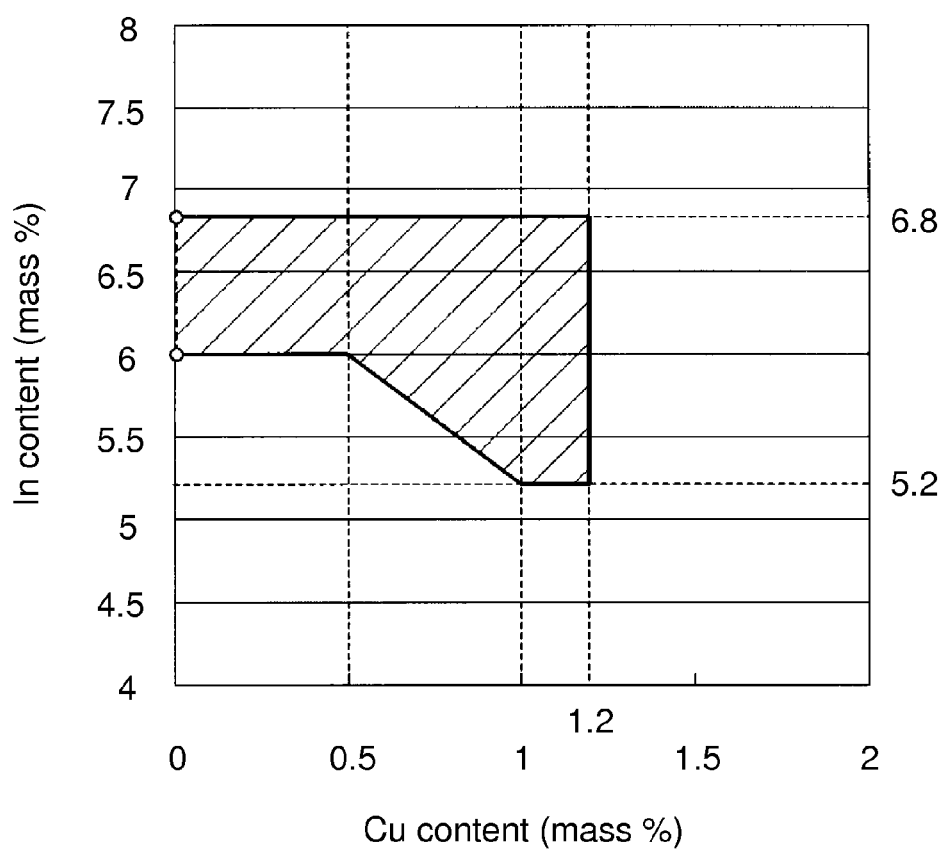
FIG. 9 is a graph showing relation between the Cu content and the In content in the solder material in accordance with the embodiment.

FIG. 9 is a graph showing relation between the Cu content and the In content in the solder material in accordance with the embodiment in which 1.2 mass % as the upper limit value of the Cu content is added to FIG. 7. That is to say, in FIG. 9, a hatched area satisfies the Cu content and the In content of the solder material of the present disclosure. The hatched area includes solid lines but does not include broken lines and white points (o).

Table 2 shows the relation between the compositions of various types of solder material before soldering and the change of the In content after soldering, as well as the results of the reliability determination and the strength determination in a combination of the Au substrate electrode and the Au component electrode. Samples include 17 samples of Examples 1 to 13 and Comparative Examples 1 to 4.

As to the strength determination, based on the tensile strength of the solder material, "S1" shows that the tensile strength satisfies not less than 60 MPa enabling use in chip components having a size of up to 0.9 mm×0.8 mm. "S2" shows that the tensile strength satisfies not less than 65 MPa enabling use in large-size semiconductor components such as QFP (Quad Flat Package) and BGA (Ball Grid Array). "S3" shows that the tensile strength satisfies not less than 70 MPa enabling use in large-size components such as aluminum electrolytic capacitors and module components. "S4" shows that the tensile strength satisfies not less than 75 MPa enabling use in large-size components such as coils and transformers. Note here that the tensile strength is measured by using a No. 4 test piece of JIS Z 2201.

TABLE 2

| | Contents of component elements in solder material before soldering (mass %) | | | | | Content and reduction rate of In after soldering (mass %) | | | Reliability determination | | | Strength determination | |
|---|---|---|---|---|---|---|---|---|---|---|---|---|---|
| | Sn | Ag | In | Bi | Cu | In | Det. | Reduction rate of In | Number of cycles | 2000 cyc or more | 2250 cyc or more | Tensile strength (MPa) | Det. |
| Ex. 1 | Bal. | 3.5 | 5.9 | 0.5 | 0.80 | 5.5 | G | −0.4 | 2200 | G | NG | 70.4 | S3 |
| Ex. 2 | Bal. | 2.6 | 6.8 | 0.3 | 0.50 | 6.0 | G | −0.8 | 2300 | G | G | 66.3 | S2 |

TABLE 2-continued

| | Contents of component elements in solder material before soldering (mass %) | | | | | Content and reduction rate of In after soldering (mass %) | | | Reliability determination | | | Strength determination | |
|---|---|---|---|---|---|---|---|---|---|---|---|---|---|
| | Sn | Ag | In | Bi | Cu | In | Det. | Reduction rate of In | Number of cycles | 2000 cyc or more | 2250 cyc or more | Tensile strength (MPa) | Det. |
| Ex. 3 | Bal. | 0.5 | 6.7 | 0.3 | 0.20 | 5.9 | G | −0.8 | 2250 | G | G | 61.4 | S1 |
| Ex. 4 | Bal. | 2.2 | 6.8 | 0.7 | 1.20 | 6.8 | G | 0.0 | 2000 | G | NG | 76.5 | S4 |
| Ex. 5 | Bal. | 3.8 | 6.0 | 0.6 | 1.10 | 5.9 | G | −0.1 | 2250 | G | G | 77.1 | S4 |
| Ex. 6 | Bal. | 3.0 | 6.5 | 0.2 | 0.95 | 6.3 | G | −0.2 | 2250 | G | G | 74.9 | S3 |
| Ex. 7 | Bal. | 0.7 | 6.6 | 0.9 | 0.60 | 5.9 | G | −0.7 | 2250 | G | G | 66.3 | S2 |
| Ex. 8 | Bal. | 1.8 | 6.7 | 0.7 | 0.80 | 6.3 | G | −0.4 | 2250 | G | G | 71.3 | S3 |
| Ex. 9 | Bal. | 1.0 | 5.3 | 1.0 | 1.00 | 5.3 | G | 0.0 | 2000 | G | NG | 75.1 | S4 |
| Ex. 10 | Bal. | 1.8 | 6.0 | 0.4 | 0.50 | 5.2 | G | −0.8 | 2000 | G | NG | 68.3 | S2 |
| Ex. 11 | Bal. | 3.5 | 6.1 | 1.0 | 1.20 | 6.0 | G | −0.1 | 2300 | G | G | 78.6 | S4 |
| Ex. 12 | Bal. | 3.0 | 5.2 | 0.8 | 1.20 | 5.2 | G | 0.0 | 2000 | G | NG | 76.7 | S4 |
| Ex. 13 | Bal. | 0.7 | 6.3 | 0.8 | 0.40 | 5.5 | G | −0.8 | 2100 | G | NG | 63.4 | S1 |
| CEx. 1 | Bal. | 3.5 | 5.7 | 0.5 | 0.20 | 4.9 | NG | −0.8 | 1650 | NG | NG | 74.8 | S3 |
| CEx. 2 | Bal. | 2.8 | 5.5 | 0.3 | 0.50 | 4.7 | NG | −0.8 | 1500 | NG | NG | 64.1 | S1 |
| CEx. 3 | Bal. | 3.0 | 5.8 | 0.8 | 0.40 | 5.0 | NG | −0.8 | 1850 | NG | NG | 74.9 | S3 |
| CEx. 4 | Bal. | 3.5 | 5.9 | 0.5 | — | 5.1 | NG | −0.8 | 1950 | NG | NG | 60.7 | S1 |

Ex. = Example,
CEx. = Comparative Example,
Bal = balance,
cyc = cycles,
Det. = determination A balance after the In content is changed is measured by analyzing the In content inside the solder portion by using EDX after soldering to the Au electrode is carried out.

In the determination of the change of the In content, "G (Good)" shows that the In content after soldering falls in a range of 5.2 to 6.8 mass %, and "NG (No Good)" shows that the In content falls in a range of less than 5.2 mass %.

As to the reliability determination, the reliability test of vehicle-mounted products is based on the requirements specification that the number of cycles of the heat cycle test satisfies not less than 2000 cycles or not less than 2250 cycles. "G (Good)" shows that the requirement is satisfied and "NG (No Good)" shows that the requirement is not satisfied.

Results of the reliability determination of Examples 1 to 13 show that when the solder material having a composition of Sn—Ag—Bi—In contains a predetermined amount of Cu, reduction of the In content is suppressed. Therefore, it is demonstrated that any of Examples 1 to 13 satisfy not less than 2000 cycles of the requirements specification.

In Comparative Examples 1 to 4, since addition of an element necessary for suppressing reduction of the In content is not carried out, the In content after soldering is 4.7 to 5.1 mass % (change of the In content is −0.8 mass %). That is to say, it is demonstrated that not less than 2000 cycles of the requirements specification is not satisfied.

Next, Table 3 shows the relation between the compositions of various types of solder material before soldering and the change of the In content after soldering, as well as the results of the reliability determination and the strength determination in a combination of the Au substrate electrode and the Cu component electrode. Samples include 17 samples of Examples 14 to 26 and Comparative Examples 5 to 8. Each determination is the same as that of Table 2 mentioned above.

TABLE 3

| | Contents of component elements in solder material before soldering (mass %) | | | | | Content and reduction rate of In after soldering (mass %) | | | Reliability determination | | | Strength determination | |
|---|---|---|---|---|---|---|---|---|---|---|---|---|---|
| | Sn | Ag | In | Bi | Cu | In | Det. | Reduction rate of In | Number of cycles | 2000 cyc or more | 2250 cyc or more | Tensile strength (MPa) | Det. |
| Ex. 14 | Bal. | 3.5 | 5.9 | 0.5 | 0.80 | 5.5 | G | −0.3 | 2200 | G | NG | 70.6 | S3 |
| Ex. 15 | Bal. | 2.6 | 6.8 | 0.3 | 0.50 | 6.0 | G | −0.8 | 2300 | G | G | 66.2 | S2 |
| Ex. 16 | Bal. | 0.5 | 6.7 | 0.3 | 0.20 | 5.9 | G | −0.8 | 2250 | G | G | 61.2 | S1 |
| Ex. 17 | Bal. | 2.2 | 6.8 | 0.7 | 1.20 | 6.8 | G | 0.0 | 2000 | G | NG | 76.7 | S4 |
| Ex. 18 | Bal. | 3.8 | 6.0 | 0.6 | 1.10 | 5.9 | G | −0.1 | 2250 | G | G | 77.3 | S4 |
| Ex. 19 | Bal. | 3.0 | 6.5 | 0.2 | 0.95 | 6.3 | G | −0.2 | 2250 | G | G | 74.9 | S3 |
| Ex. 20 | Bal. | 0.7 | 6.6 | 0.9 | 0.60 | 6.0 | G | −0.6 | 2250 | G | G | 66.2 | S2 |
| Ex. 21 | Bal. | 1.8 | 6.7 | 0.7 | 0.80 | 6.3 | G | −0.4 | 2250 | G | G | 71.5 | S3 |
| Ex. 22 | Bal. | 1.0 | 5.3 | 1.0 | 1.00 | 5.3 | G | 0.0 | 2000 | G | NG | 75.2 | S4 |
| Ex. 23 | Bal. | 1.8 | 6.0 | 0.4 | 0.50 | 5.2 | G | −0.8 | 2000 | G | NG | 68.5 | S1 |
| Ex. 24 | Bal. | 3.5 | 6.1 | 1.0 | 1.20 | 6.0 | G | −0.1 | 2300 | G | G | 78.8 | S4 |
| Ex. 25 | Bal. | 3.0 | 5.2 | 0.8 | 1.20 | 5.2 | G | 0.0 | 2000 | G | NG | 76.7 | S4 |
| Ex. 26 | Bal. | 0.7 | 6.3 | 0.8 | 0.40 | 5.5 | G | −0.8 | 2100 | G | NG | 63.6 | S1 |
| CEx. 5 | Bal. | 3.5 | 5.7 | 0.5 | 0.20 | 4.9 | NG | −0.8 | 1650 | NG | NG | 74.9 | S3 |

TABLE 3-continued

| | Contents of component elements in solder material before soldering (mass %) | | | | | Content and reduction rate of In after soldering (mass %) | | Reliability determination | | | Strength determination | |
|---|---|---|---|---|---|---|---|---|---|---|---|---|
| | Sn | Ag | In | Bi | Cu | In | Reduction rate of In Det. | Number of cycles | 2000 cyc or more | 2250 cyc or more | Tensile strength (MPa) | Det. |
| CEx. 6 | Bal. | 2.8 | 5.5 | 0.3 | 0.30 | 4.7 NG | −0.8 | 1500 | NG | NG | 64.3 | S1 |
| CEx. 7 | Bal. | 3.0 | 5.8 | 0.8 | 0.40 | 5.0 NG | −0.8 | 1850 | NG | NG | 74.9 | S3 |
| CEx. 8 | Bal. | 3.5 | 5.9 | 0.5 | — | 5.1 NG | −0.8 | 1950 | NG | NG | 60.8 | S1 |

Ex. = Example,
CEx. = Comparative Example,
Bal = balance,
cyc = cycles,
Det. = determination Results of the reliability determination of Examples 14 to 26 show that when the solder material having a composition of Sn—Ag—Bi—I contains a predetermined amount of Cu, reduction of the In content is suppressed. Therefore, it is demonstrated that any of Examples 14 to 26 satisfy not less than 2000 cycles of the requirements specification. Examples 14 to 26 show a combination of the Au substrate electrode and the Cu component electrode, but it is thought that the same results are obtained in a combination of the Cu substrate electrode and the Au component electrode.

In Comparative Examples 5 to 8, since addition of an element necessary for suppressing reduction of the In content is not carried out, the In content after soldering is 4.7 to 5.1 mass % (change of the In content is −0.8 mass %). That is to say, it is demonstrated that not less than 2000 cycles of the requirements specification is not satisfied.

Next, Table 4 shows the relation between the compositions of various types of solder material that does not contain Bi and the change of the In content, as well as the results of the reliability determination and the strength determination in a combination of the Au substrate electrode and Au component electrode. Samples include 13 samples of Examples 27 to 39.

In Examples 27 to 39 of Table 4, since all the results of the reliability determination satisfy the requirement of not less than 2000 cycles, it is shown that the change in the In content is not influenced even if Bi is not contained in the solder material. Bi is added to adjust the melting temperature of the solder material, the content of Bi does not have a large influence on the thermal fatigue properties of the solder material.

From the results of the reliability determination shown in Examples 1 to 39 of Tables 2 to 4, in order to satisfy the reliability evaluation of vehicle-mounted products in soldering to the Au electrode and the Cu electrode, the solder material having a composition of Sn—Ag—Bi—In before soldering satisfies the following relation.

That is to say, the solder material includes:
Ag satisfying $0.3 \leq [Ag] \leq 4.0$;
Bi satisfying $0 \leq [Bi] \leq 1.0$; and
Cu satisfying $0 < [Cu] \leq 1.2$.

When the solder material includes In in the range of $6.0 \leq [In] 6.8$ when [Cu] falls within a range of $0 < [Cu] < 0.5$;
in the range of $5.2 + (6 − (1.55 \times [Cu] + 4.428)) \leq [In] \leq 6.8$ when [Cu] falls within a range of $0.5 \leq [Cu] \leq 1.0$;

TABLE 4

| | Contents of component elements in solder material before soldering (mass %) | | | | | Content and reduction rate of In after soldering (mass %) | | Reliability determination | | | Strength determination | |
|---|---|---|---|---|---|---|---|---|---|---|---|---|
| | Sn | Ag | In | Bi | Cu | In | Reduction rate of In Det. | Number of cycles | 2000 cyc or more | 2250 cyc or more | Tensile strength (MPa) | Det. |
| Ex. 27 | Bal. | 0.7 | 5.9 | — | 0.75 | 5.5 G | −0.5 | 2150 | G | NG | 65.6 | S2 |
| Ex. 28 | Bal. | 4.0 | 5.6 | — | 1.00 | 5.5 G | −0.1 | 2200 | G | NG | 74.3 | S3 |
| Ex. 29 | Bal. | 0.3 | 6.0 | — | 0.50 | 5.2 G | −0.8 | 2000 | G | NG | 66.3 | S2 |
| Ex. 30 | Bal. | 2.9 | 6.0 | — | 0.90 | 5.8 G | −0.2 | 2250 | G | G | 72.4 | S3 |
| Ex. 31 | Bal. | 3.5 | 5.6 | — | 1.20 | 5.6 G | 0.0 | 2200 | G | NG | 76.2 | S4 |
| Ex. 32 | Bal. | 0.5 | 6.8 | — | 0.60 | 6.2 G | −0.6 | 2250 | G | G | 67.5 | S2 |
| Ex. 33 | Bal. | 1.2 | 5.8 | — | 1.20 | 5.4 G | −0.1 | 2100 | G | NG | 77.1 | S4 |
| Ex. 34 | Bal. | 3.2 | 6.2 | — | 1.10 | 6.1 G | −0.1 | 2300 | G | G | 75.7 | S4 |
| Ex. 35 | Bal. | 1.1 | 6.1 | — | 0.40 | 5.3 G | −0.8 | 2100 | G | NG | 61.8 | S1 |
| Ex. 36 | Bal. | 2.1 | 6.5 | — | 0.95 | 6.4 G | −0.1 | 2200 | G | NG | 73.3 | S3 |
| Ex. 37 | Bal. | 1.9 | 6.6 | — | 0.70 | 6.0 G | −0.6 | 2300 | G | G | 67.3 | S2 |
| Ex. 38 | Bal. | 2.8 | 6.1 | — | 0.85 | 5.9 G | −0.2 | 2250 | G | G | 73.9 | S3 |
| Ex. 39 | Bal. | 0.5 | 6.2 | — | 0.30 | 5.4 G | −0.8 | 2100 | G | NG | 63.7 | S1 |

Ex. = Example,
CEx. = Comparative Example,
Bal = balance,
cyc = cycles,
Det. = determination in the range of 5.2≤[In]≤6.8 when [Cu] falls within a range of 1.0<[Cu]≤1.2; and a balance includes only not less than 87 mass % of Sn, the requirement of the reliability determination after soldering (not less than 2000 cycles) can be satisfied.

Furthermore, the content of Ag constituting the solder material in accordance with this embodiment is determined by the following reasons.

As already described, since the thermal fatigue properties are improved by the solid solution effect of In on Sn, the thermal fatigue properties are largely changed by the In content. However, since Ag is not solid-dissolved in Sn, the thermal fatigue properties are not largely changed.

Furthermore, since the Ag content has an influence on the melting point of the solder material, the melting point is 235° C. or higher when the Ag content exceeds 4 mass %. Thus, wet spread at the time of soldering is deteriorated, so that the soldering material cannot be used. Therefore, a maximum value of the Ag content is made to be 4 mass %. Furthermore, when the Ag content becomes smaller, a deposited amount of $Ag_3Sn$ to a Sn phase is reduced, and the property of the mechanical strength is lowered. Therefore, the minimum value of the Ag content is made to be 0.3 mass %.

Next, the content of Bi constituting the solder material in accordance with this embodiment is determined by the following reason. As described in Table 4, the minimum value can be zero from the viewpoint that thermal fatigue properties of the solder material are not influenced. Furthermore, since Bi has a property of segregating inside the solder alloy, when Bi is more than 1 mass %, a segregating amount is increased and an alloy become brittle and cannot be used. Consequently, the maximum value of the Bi content is made to be 1 mass %.

As mentioned above, Ag and Bi do not have a large influence on the thermal fatigue properties of the solder material. Therefore, it is thought that an effect of the In content in the solder material having a composition of Sn—Ag—Bi—In can be handled similarly in the solder material having a composition of Sn—Ag—In or a composition of Sn—Bi—In. However, since the Ag content is zero in the solder material having the composition of Sn—Bi—In, the mechanical strength may be deteriorated.

As is apparent from the above description, the solder material of the present disclosure can be suitably used in soldering of the Au electrode including Ni plating containing P. The Au electrode in this case may be any of the Au substrate electrode and the Au component electrode. Furthermore, the Ni plating includes 3 to 15 mass % P, preferably 5 to 10 mass % P, and balance has a composition of Ni.

Furthermore, the above-mentioned solder material includes:
Ag satisfying 0.3≤[Ag]≤4.0;
Bi satisfying 0≤[Bi]≤1.0; and
Cu satisfying 0<[Cu]≤1.2.

Moreover, the solder material includes In in the range of 6.0≤[In]≤6.8 when [Cu] falls within a range of 0<[Cu]<0.5;
in the range of 5.2+(6−(1.55×[Cu]+4.428))≤[In]≤6.8 when [Cu] falls within a range of 0.5≤[Cu]≤1.0;
in the range of 5.2≤[In]≤6.8 when [Cu] falls within a range of 1.0<[Cu]≤1.2, and a balance includes only not less than 87 mass % of Sn.

When the above-mentioned solder material is used in soldering of the Cu electrode, the In content is not reduced. Therefore, the above-mentioned solder material can be suitably used also for a combination of the Cu substrate electrode and the Cu component electrode. Thus, according to the solder material of the present disclosure, even if the Au electrode and the Cu electrode are mixed when the electronic circuit board and the electronic component are bonded to each other by soldering, a solder portion having excellent thermal fatigue properties can be formed.

A slight amount of Cu may be contained for preventing Cu in the electrode from being eroded, but the lower limit value of the Cu content is preferably not less than 0.5 mass % at which the tensile strength satisfies not less than 65 MPa and large-size semiconductor components such as QFP and BGA can be used.

In particular, it is preferable that the solder material includes:
0.5 to 3.8 mass % of Ag;
0.2 to 1.0 mass % of Bi;
6.0 to 6.8 mass % of In; and
0.2 to 1.2 mass % of Cu, wherein the balance includes only not less than 87.2 mass % of Sn.

Specific examples of the solder material include material of Examples 2, 3, 5 to 8, 11 in Table 2. The solder material satisfies a more stringent requirement of the reliability determination (not less than 2250 cycles).

Furthermore, it is more preferable that the solder material includes:
1.8 to 3.8 mass % of Ag;
0.2 to 1.0 mass % of Bi;
6.0 to 6.7 mass % of In; and
0.8 to 1.2 mass % of Cu, wherein the balance includes only not less than 87.3 mass % of Sn.

Specific examples of the solder material include material of Examples 5, 6, 8, and 11 in Table 2. The solder material satisfies a more stringent requirement of the reliability determination (not less than 2250 cycles), and the tensile strength satisfies not less than 70 MPa enabling the use in large-size components such as aluminum electrolytic capacitors and module components.

Furthermore, it is further preferable that the solder material includes:
3.5 to 3.8 mass % of Ag;
0.6 to 1.0 mass % of Bi;
6.0 to 6.1 mass % of In; and
1.1 to 1.2 mass % of Cu, wherein the balance includes only not less than 87.9 mass % of Sn.

Specific examples of the solder material include material of Examples 5 and 11 in Table 2. The solder material satisfies a more stringent requirement of the reliability determination (not less than 2250 cycles), and the tensile strength also satisfies not less than 75 MPa enabling the use in large-size components such as coils and transformers.

Furthermore, it is preferable that when Bi is not included, the solder material includes:
0.5 to 3.2 mass % of Ag;
6.0 to 6.8 mass % of In; and
0.6 to 1.1 mass % of Cu, wherein the balance includes only not less than 88.9 mass % of Sn.

Specific examples of the solder material include material of Examples 30, 32, 34, 37, and 38 in Table 4. The solder material satisfies a more stringent requirement of the reliability determination (not less than 2250 cycles).

Furthermore, it is more preferable that when Bi is not included, the solder material includes:
2.8 to 3.2 mass % of Ag;
6.0 to 6.2 mass % of In; and
0.85 to 1.1 mass % of Cu, wherein the balance includes only not less than 89.5 mass % of Sn.

Specific examples of the solder material include material of Examples 30, 34, and 38 in Table 4. The solder material satisfies a more stringent requirement of the reliability determination (not less than 2250 cycles), and the tensile strength also satisfies not less than 70 MPa enabling the use in large-size components such as aluminum electrolytic capacitors and module components.

A bonded structure of the present disclosure includes an electronic circuit board having a substrate electrode, and an electronic component having a component electrode. Herein, examples of the electronic circuit board include patterned insulating substrates of various FR grades. Furthermore, examples of the electronic component include large-size semiconductor components such as chip components, QFP, and BGA, large-size components such as aluminum electrolytic capacitors and module components, large-size components such as coils and transformers, and the like.

In the above-mentioned bonded structure, at least one of the substrate electrode and the component electrode is an Au electrode. For example, a case where the substrate electrode is an Au electrode (Au substrate electrode) and the component electrode is a Cu electrode (Cu component electrode), a case where the substrate electrode is a Cu electrode (Cu substrate electrode) and the component electrode is an Au electrode (Au component electrode), and a case where the substrate electrode is an Au electrode (Au substrate electrode) and the component electrode is an Au electrode (Au component electrode) are included.

In the above-mentioned bonded structure, the substrate electrode and the component electrode are bonded to each other with the solder material of the present disclosure. The solder material of the present disclosure satisfies reliability evaluation of vehicle-mounted products in soldering to the Au electrode and Cu electrode from the results of the reliability determination shown in Tables 2 to 4 and Examples 1 to 39 as mentioned above. Therefore, when the electronic circuit board and the electronic component are bonded to each other by soldering, even if both the Au electrode and the Cu electrode are mixed, a solder portion having excellent thermal fatigue properties can be formed. Note here that the content of Cu contained in the solder material can be appropriately changed according to the content of P contained in the Ni plating of the Au electrode.

Figure 10:
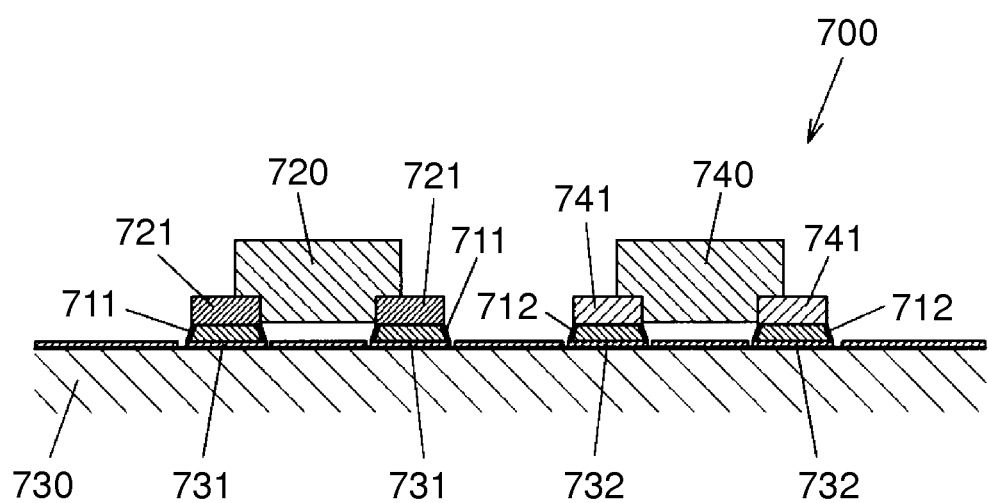
FIG. 10 is a sectional view schematically showing a bonded structure in accordance with the embodiment.

FIG. 10 is a sectional view schematically showing bonded structure 700 in accordance with the embodiment.

Bonded structure 700 is configured by bonding electronic circuit board 730 provided with Au substrate electrodes 731 and 732 and electronic component 720 having Cu component electrodes 721 and electronic component 740 having Au component electrodes 741 to each other by soldering. In bonded structure 700, Au substrate electrodes 731 of electronic circuit board 730 and Cu component electrodes 721 of electronic component 720 are bonded to each other with solder portions 711. Furthermore, Au substrate electrodes 732 of electronic circuit board 730 and Au component electrodes 741 of electronic component 740 are bonded to each other with solder portions 712. Solder portions 711 and 712 are formed of the solder material having a composition of Sn—Ag—Bi—In—Cu or Sn—Ag—In—Cu in accordance with the present disclosure. As is apparent from the results of the reliability determination shown in Examples 1 to 39 of Tables 2 to 4, bonded structure 700 satisfies the requirements specification of the reliability test of a vehicle-mounted product. In bonded structure 700, Au substrate electrodes 731 and 732 may be a Cu substrate electrode.

Figure 11A:
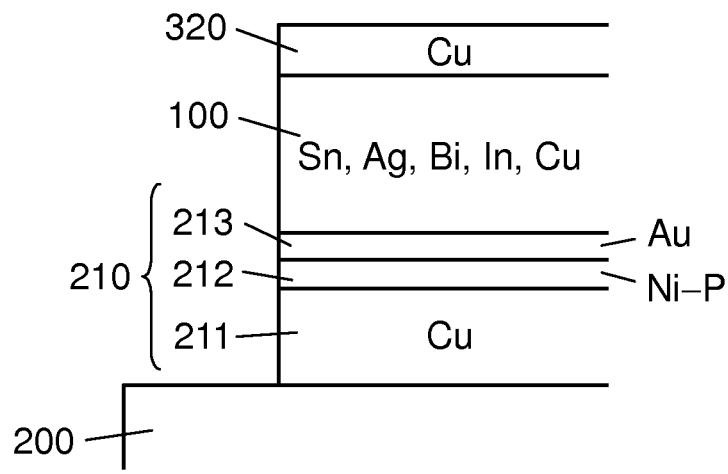
FIG. 11A is a sectional view schematically showing a structure before the Au substrate electrode of the electronic circuit board and the Cu component electrode of the electronic component are soldered to each other.

FIG. 11A is a sectional view schematically showing a structure before Au substrate electrode 210 of electronic circuit board 200 and Cu component electrode 320 of the electronic component are soldered to each other. Au substrate electrode 210 is provided with Cu electrode 211, Ni plating 212, and Au flash plating 213 from an electronic circuit board 200 side. Solder material 100 having a composition of Sn—Ag—Bi—In—Cu is interposed between Au substrate electrode 210 and Cu component electrode 320.

Figure 11B:
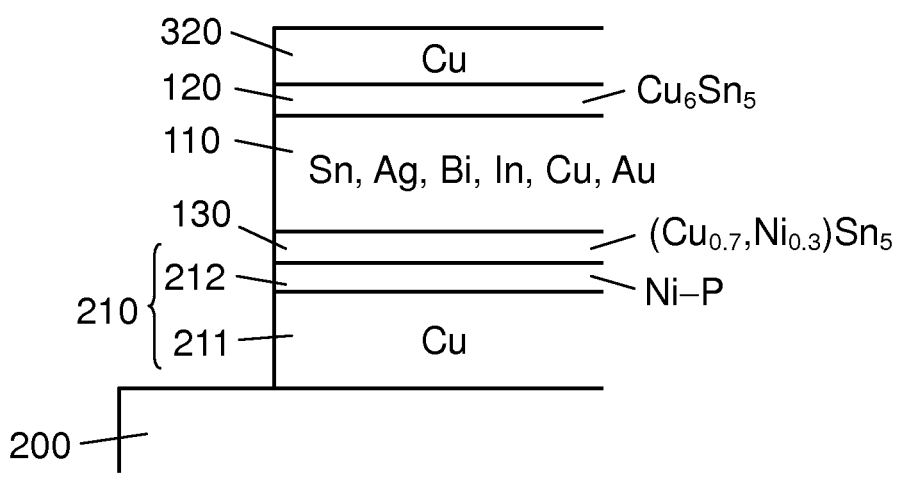
FIG. 11B is a sectional view schematically showing a structure after the Au substrate electrode of the electronic circuit board and the Cu component electrode of the electronic component are soldered to each other.

FIG. 11B is a sectional view schematically showing a structure after Au substrate electrode 210 of electronic circuit board 200 and Cu component electrode 320 of the electronic component are soldered to each other. Au substrate electrode 210 includes Ni plating 212 containing P. After soldering, (Cu,Ni)Sn compound 130 such as $(Cu_{0.7}, Ni_{0.3})_6Sn_5$ is generated between Au substrate electrode 210 and the solder portion. This (Cu,Ni)Sn compound 130 is useful for preventing the In content in solder material 100 from being reduced. On the other hand, $Cu_6Sn_5$ compound 120 is generated between Cu component electrode 320 and solder portion 110. Since In is not involved in the generation of $Cu_6Sn_5$ compound 120, the In content of solder material 100 is not reduced. In FIGS. 11A and 11B, an electronic component is not shown.

Figure 12A:
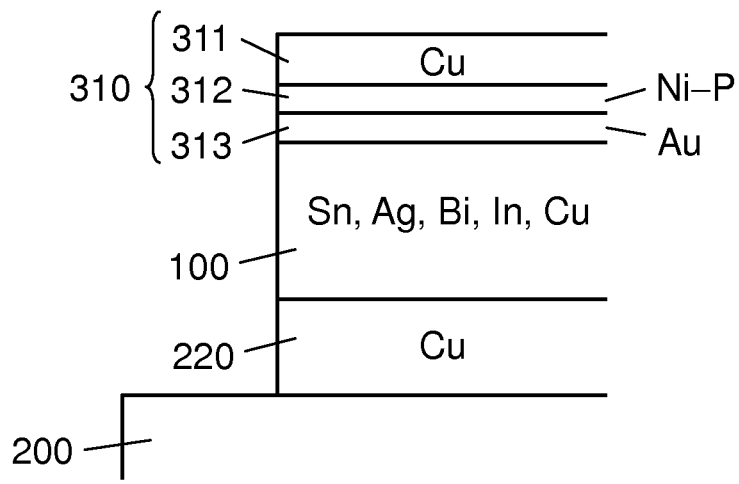
FIG. 12A is a sectional view schematically showing a structure before the Cu substrate electrode of the electronic circuit board and the Au component electrode of the electronic component are soldered to each other.

FIG. 12A is a sectional view schematically showing a structure before Cu substrate electrode 220 of electronic circuit board 200 and Au component electrode 310 of the electronic component are soldered to each other. Au component electrode 310 is provided with Cu electrode 311, Ni plating 312, and Au flash plating 313 from an electronic component side. Solder material 100 having a composition of Sn—Ag—Bi—In—Cu is interposed between Cu substrate electrode 220 and Au component electrode 310.

Figure 12B:
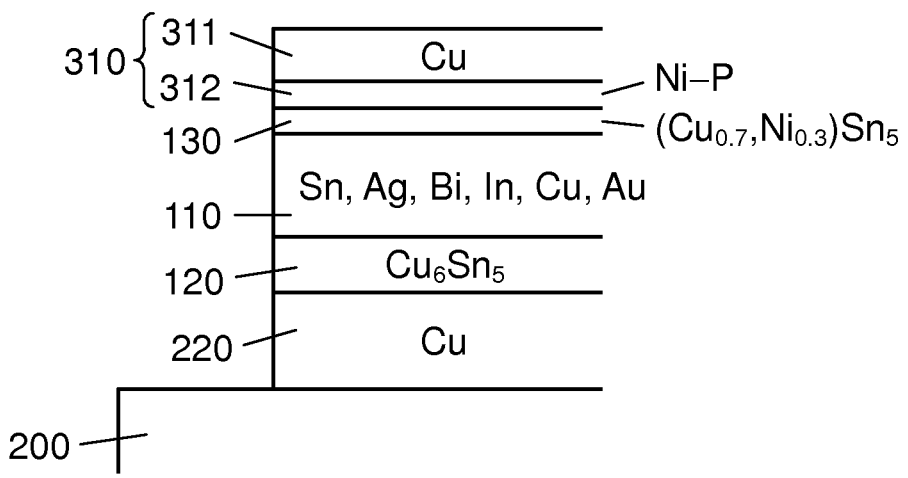
FIG. 12B is a sectional view schematically showing a structure after the Cu substrate electrode of the electronic circuit board and the Au component electrode of the electronic component are soldered to each other.

FIG. 12B is a sectional view schematically showing a structure after Cu substrate electrode 220 of electronic circuit board 200 and Au component electrode 310 of the electronic component are soldered to each other. Au component electrode 310 includes Ni plating 312 containing P. After soldering, (Cu,Ni)Sn compound 130 such as $(Cu_{0.7}, Ni_{0.3})_6Sn_5$ is generated between Au component electrode 310 and solder portion 110. This (Cu,Ni)Sn compound 130 is useful for preventing the In content in solder material 100 from being reduced. On the other hand, $Cu_6Sn_5$ compound 120 is generated between Cu substrate electrode 220 and solder portion 110. Since In is not involved in the generation of $Cu_6Sn_5$ compound 120, the In content of solder material 100 is not reduced. In FIGS. 12A and 12B, an electronic component is not shown.

Figure 13A:
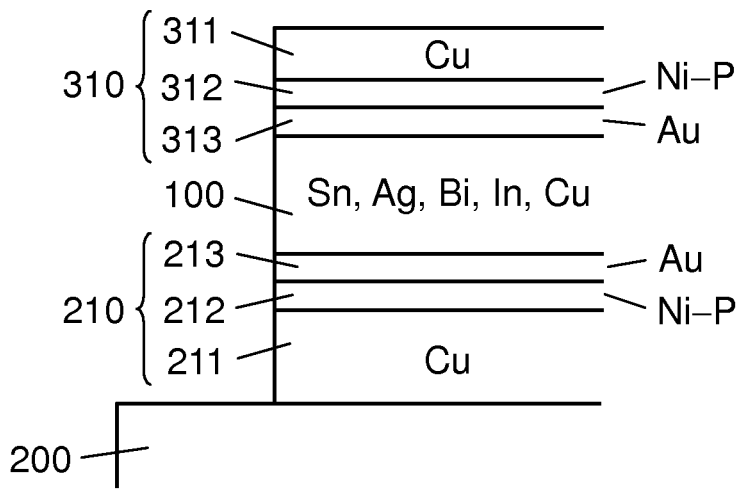
FIG. 13A is a sectional view schematically showing a structure before the Au substrate electrode of the electronic circuit board and the Au component electrode of the electronic component are soldered to each other.

FIG. 13A is a sectional view schematically showing a structure before Au substrate electrode 210 of electronic circuit board 200 and Au component electrode 310 of the electronic component are soldered to each other. Au substrate electrode 210 is provided with Cu electrode 211, Ni plating 212, and Au flash plating 213 from an electronic circuit board 200 side. Au component electrode 310 is provided with Cu electrode 311, Ni plating 312, and Au flash plating 313 from an electronic component side. Solder material 100 having a composition of Sn—Ag—Bi—In—Cu is interposed between Au substrate electrode 210 and Au component electrode 310.

Figure 13B:
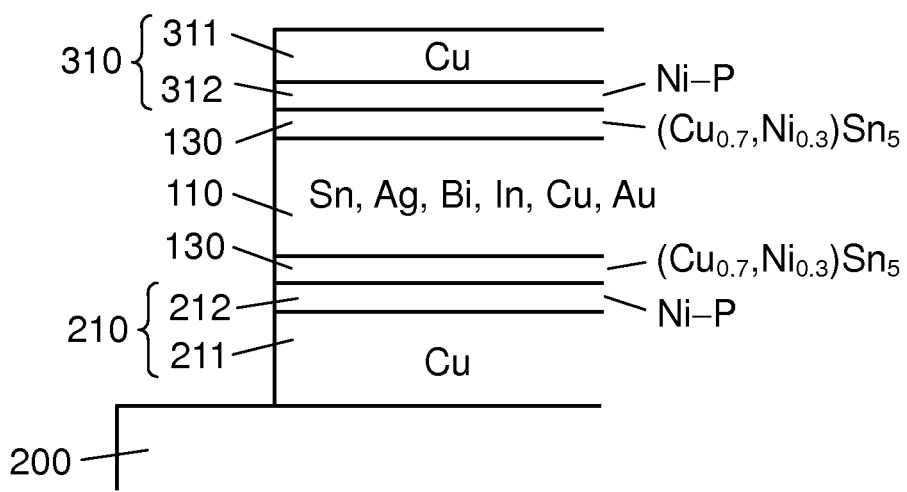
FIG. 13B is a sectional view schematically showing a structure after the Au substrate electrode of the electronic circuit board and the Au component electrode of the electronic component are soldered to each other.

FIG. 13B is a sectional view schematically showing a structure after Au substrate electrode 210 of electronic circuit board 200 and Au component electrode 310 of the electronic component are soldered to each other. Au substrate electrode 210 includes Ni plating 212 containing P. After soldering, (Cu,Ni)Sn compound 130 such as $(Cu_{0.7}, Ni_{0.3})_6Sn_5$ is generated between Au substrate electrode 210 and solder portion 110 after soldering. Similarly, Au component electrode 310 includes Ni plating 312 containing P, but (Cu,Ni)Sn compound 130 such as $(Cu_{0.7}, Ni_{0.3})_6Sn_5$ is generated between Au component electrode 310 and solder portion 110 after soldering. This (Cu,Ni)Sn compound 130 is useful for preventing the In content in solder material 100 from being reduced. In FIGS. 13A and 13B, an electronic component is not shown.

Solder material and a bonded structure in accordance with the present disclosure can form a solder portion having excellent thermal fatigue properties even if an Au electrode and a Cu electrode are mixed when an electronic circuit board and an electronic component are bonded to each other by soldering. For example, they are suitably used in paste or the like to be used in soldering.

What is claimed is:

1. Solder material used in soldering a component electrode and a substrate electrode,
    where the component electrode includes an Au electrode and a Cu electrode, or the substrate electrode includes an Au electrode and a Cu electrode, the solder material comprising:
    Ag (silver) satisfying $0.3 \leq [Ag] < 4.0$;
    where 0.5 mass % and 1.0 mass % of Ag are excluded,
    Bi (bismuth) satisfying $0 \leq [Bi] \leq 1.0$;
    Cu (copper) satisfying $0.2 \leq [Cu] \leq 1.2$;
    In (indium) in a range of $6.0 \leq [In] 6.8$ when [Cu] falls within a range of $0.2 \leq [Cu] < 0.5$;
    In in a range of $5.2 + (6 - (1.55 \times [Cu] + 4.428)) \leq [In] 6.8$ when [Cu] falls within a range of $0.5 [Cu] 1.0$; and
    In in a range of $5.2 \leq [In] \leq 6.8$ when [Cu] falls within a range of $1.0 < [Cu] \leq 1.2$,
    with a balance including $87 \leq [Sn]$,
    where contents (mass %) of Ag, Bi, Cu, In, and Sn (tin) in the solder material are denoted by [Ag], [Bi], [Cu], [In] and [Sn], respectively.

2. The solder material of claim 1, wherein
    Ag satisfies $0.5 \leq [Ag] \leq 3.8$,
    Bi satisfies $0.2 \leq [Bi] \leq 1.0$,
    In satisfies $6.0 \leq [In] \leq 6.8$,
    Cu satisfies $0.2 \leq [Cu] \leq 1.2$, and
    a balance includes only not less than 87.2 mass % of Sn.

3. The solder material of claim 1, wherein
    Ag satisfies $1.8 \leq [Ag] \leq 3.8$,
    Bi satisfies $0.2 \leq [Bi] \leq 1.0$,
    In satisfies $6.0 \leq [In] \leq 6.7$,
    Cu satisfies $0.8 \leq [Cu] \leq 1.2$, and
    a balance includes only not less than 87.3 mass % of Sn.

4. The solder material of claim 1, wherein
    Ag satisfies $3.5 \leq [Ag] \leq 3.8$,
    Bi satisfies $0.6 \leq [Bi] \leq 1.0$,
    In satisfies $6.0 \leq [In] \leq 6.1$,
    Cu satisfies $1.1 \leq [Cu] \leq 1.2$, and
    a balance includes only not less than 87.9 mass % of Sn.

5. The solder material of claim 1, wherein
    Bi satisfies $[Bi] = 0$,
    Ag satisfies $0.5 [Ag] \leq 3.2$,
    In satisfies $6.0 [In] \leq 6.8$,
    Cu satisfies $0.6 [Cu] \leq 1.1$, and
    a balance includes only not less than 88.9 mass % of Sn.

6. The solder material of claim 1, wherein
    Bi satisfies $[Bi] = 0$,
    Ag satisfies $2.8 [Ag] \leq 3.2$,
    In satisfies $6.0 [In] \leq 6.2$,
    Cu satisfies $0.85 [Cu] \leq 1.1$, and
    a balance includes only not less than 89.5 mass % of Sn.

7. A bonded structure comprising:
    solder material defined in claim 1;
    an electronic circuit board having a plurality of substrate electrodes; and
    an electronic component having a plurality of component electrodes,
    wherein any of the plurality of substrate electrodes and the plurality of component electrodes is the Au electrode including Ni plating containing P (phosphorous), and
    the plurality of substrate electrodes and the plurality of component electrodes are bonded to each other with the solder material.

8. A bonded structure comprising:
    solder material defined in claim 2;
    an electronic circuit board having a plurality of substrate electrodes; and
    an electronic component having a plurality of component electrodes,
    wherein any of the plurality of substrate electrodes and the plurality of component electrodes is the Au electrode including Ni plating containing P (phosphorous), and
    the plurality of substrate electrodes and the plurality of component electrodes are bonded to each other with the solder material.

9. A bonded structure comprising:
    solder material defined in claim 3;
    an electronic circuit board having a plurality of substrate electrodes; and
    an electronic component having a plurality of component electrodes,
    wherein any of the plurality of substrate electrodes and the plurality of component electrodes is the Au electrode including Ni plating containing P (phosphorous), and
    the plurality of substrate electrodes and the plurality of component electrodes are bonded to each other with the solder material.

10. A bonded structure comprising:
    solder material defined in claim 4;
    an electronic circuit board having a plurality of substrate electrodes; and
    an electronic component having a plurality of component electrodes,
    wherein any of the plurality of substrate electrodes and the plurality of component electrodes is the Au electrode including Ni plating containing P (phosphorous), and
    the plurality of substrate electrodes and the plurality of component electrodes are bonded to each other with the solder material.

11. A bonded structure comprising:
    solder material defined in claim 5;
    an electronic circuit board having a plurality of substrate electrodes; and
    an electronic component having a plurality of component electrodes,
    wherein any of the plurality of substrate electrodes and the plurality of component electrodes is the Au electrode including Ni plating containing P (phosphorous), and
    the plurality of substrate electrodes and the plurality of component electrodes are bonded to each other with the solder material.

12. A bonded structure comprising:
    solder material defined in claim 6;
    an electronic circuit board having a plurality of substrate electrodes; and
    an electronic component having a plurality of component electrodes, wherein any of the plurality of substrate electrodes and the plurality of component electrodes is the Au electrode including Ni plating containing P (phosphorous), and the plurality of substrate electrodes and the plurality of component electrodes are bonded to each other with the solder material.

* * * * *